(12) United States Patent
Zhu et al.

(10) Patent No.: US 9,371,196 B2
(45) Date of Patent: Jun. 21, 2016

(54) TRANSPORTATION METHOD AND TRANSPORTATION DEVICE OF LIQUID CRYSTAL PANEL

(75) Inventors: Erqing Zhu, Shenzhen (CN); Chunhao Wu, Shenzhen (CN); Kunhsien Lin, Shenzhen (CN); Xiande Li, Shenzhen (CN); Weibing Yang, Shenzhen (CN); Zhenhua Guo, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 827 days.

(21) Appl. No.: 13/515,287

(22) PCT Filed: May 8, 2012

(86) PCT No.: PCT/CN2012/075157
§ 371 (c)(1),
(2), (4) Date: Jun. 11, 2012

(87) PCT Pub. No.: WO2013/159383
PCT Pub. Date: Oct. 31, 2013

(65) Prior Publication Data
US 2013/0287534 A1    Oct. 31, 2013

(30) Foreign Application Priority Data

Apr. 27, 2012    (CN) .......................... 2012 1 0129957

(51) Int. Cl.
*B25J 15/00*    (2006.01)
*B65G 49/06*    (2006.01)
*H01L 21/677*   (2006.01)

(52) U.S. Cl.
CPC ............ *B65G 49/061* (2013.01); *B65G 49/067* (2013.01); *H01L 21/67766* (2013.01)

(58) Field of Classification Search
CPC .......................... B65G 49/061; B65G 49/067
USPC ......................................................... 414/671
See application file for complete search history.

(56) References Cited

U.S. PATENT DOCUMENTS 3,693,465 A * 9/1972 Caraway ..................... 74/110
4,533,290 A * 8/1985 Hackauf ...................... 414/667
(Continued)

FOREIGN PATENT DOCUMENTS

KR    10-2011-0131457 A    12/2011

OTHER PUBLICATIONS

"Wikipedia Servomotor", no author, printed Apr. 13, 2015 pp. 1-4 from http://en.wikipedia.org/wiki/Servomotor.*

*Primary Examiner* — Scott Lowe
(74) *Attorney, Agent, or Firm* — Cheng-Ju Chiang

(57) ABSTRACT

The present invention provides a transportation method and a transportation device of a liquid crystal panel. The method includes (1) providing a transportation device, wherein the transportation device comprises a device body, linear rails mounted to the device body, a plurality of forks mounted in sequence to the linear rails, and servo motors mounted to the device body, the servo motors being coupled to the plurality of forks to drive the plurality of forks to slide along the linear rails; (2) adjusting spacing distance between the plurality of forks according to the size of a liquid crystal panel to be transported; (3) operating the transportation device to move the forks to a location under the liquid crystal panel to be transported in order to have the liquid crystal panel positioned on the plurality of forks; and (4) operating the transportation device to transport the liquid crystal panel to a designated site.

7 Claims, 6 Drawing Sheets

(56) References Cited

U.S. PATENT DOCUMENTS

| | | | |
|---|---|---|---|
| 5,096,363 A * | 3/1992 | Weinert et al. | 414/667 |
| 5,273,244 A | 12/1993 | Ono | |
| 7,632,055 B2 * | 12/2009 | Foroni | 414/667 |
| 7,670,555 B2 * | 3/2010 | Hoover et al. | 422/65 |
| 2003/0178866 A1 * | 9/2003 | Chae et al. | 294/119.1 |
| 2004/0261411 A1 * | 12/2004 | MacGregor | 60/527 |
| 2005/0072621 A1 * | 4/2005 | Hara et al. | 180/444 |
| 2005/0211531 A1 * | 9/2005 | Kim et al. | 198/618 |

\* cited by examiner

TRANSPORTATION METHOD AND TRANSPORTATION DEVICE OF LIQUID CRYSTAL PANEL

BACKGROUND OF THE INVENTION

1. Field of the Invention

The present invention relates to the field of manufacture of a liquid crystal display, and in particular to a transportation method and transportation device of a liquid crystal panel.

2. The Related Arts

A manufacture process of a liquid crystal panel comprises: an array process (including thin film, yellow light, etching, and peeling) of front stage, a cell process (bonding of TFT (Thin-Film Transistor) substrate and color filter) of intermediate stage, and a module assembling process (pressing and bonding of driving IC (Integrated Circuit) and circuit board) of rear stage.

These different processes of manufacture of a liquid crystal panel must be carried out with different facilities in different environments. This makes it necessary for carrying out transportation of liquid crystal panel for multiple times before the entire manufacture is completed. Generally, a liquid crystal panel is formed by processing glass substrates and thus breaking is easily caused during transportation. The conventional way of transportation is often carried out by using a robot hand as transportation means, whereby during transportation, the liquid crystal panel is carried on forks of the robot hand.

The conventional robot hand is often provided with forks of a fixed number and at fixed locations. Generally, two forks are used for transporting a small-sized liquid crystal panel, but, in transporting a large-sized liquid crystal panel, using two forks usually leads to an increased amount of deflection of the large-sized liquid crystal panel. Reference is now made to FIG. 1, which is a schematic view illustrating the amount of deflecting deformation of a large-sized liquid crystal panel during transportation of the liquid crystal panel with a liquid crystal panel transportation device having two fixed forks. It can be seen that in transporting a liquid crystal panel 600 of a relatively large size, the liquid crystal panel 600 that is carried on forks 300 is not subjected to uniform action of forced so as to cause a relatively large amount of deflecting deformation at a location between the two forks 300. This may easily cause breaking of the panel.

Heretofore, to alleviate the chance of breaking of liquid crystal panel, each size of liquid crystal panel is provided with corresponding forks, so that the forks are changed in transporting a liquid crystal panel of a different size. However, frequent change of forks results in a great waste of time and severely affects production performance. Further, providing multiple sets of forks increases the manufacture cost and is adverse to unified management and thus leads to severe problem for optimization of the liquid crystal panel manufacture process.

SUMMARY OF THE INVENTION

An object of the present invention is to provide a transportation method of a liquid crystal panel, which enables transportation of liquid crystal panels of various sizes, reduces the time used for switching lines, and lowers manufacture cost.

Another object of the present invention is to provide a transportation device of a liquid crystal panel, which is fit to transportation of liquid crystal panels of various sizes and has a simple structure and low cost.

To achieve the objects, the present invention provides a transportation method of a liquid crystal panel, comprising the following step:

Step 1: providing a transportation device, wherein the transportation device comprises a device body, linear rails mounted to the device body, a plurality of forks mounted in sequence to the linear rails, and servo motors mounted to the device body, the servo motors being coupled to the plurality of forks to drive the plurality of forks to slide along the linear rails;

Step 2: adjusting spacing distance between the plurality of forks according to the size of a liquid crystal panel to be transported;

Step 3: operating the transportation device to move the forks to a location under the liquid crystal panel to be transported in order to have the liquid crystal panel positioned on the plurality of forks; and Step 4: operating the transportation device to transport the liquid crystal panel to a designated site.

The forks are arranged perpendicular to the linear rails with one end being coupled to the linear rails of the device body and an opposite end extending beyond the device body.

Each of the forks is connected to a transmission wire so that the fork is operatively coupled to the servo motors through the transmission wire. The servo motors drive the transmission wires to move back and forth so as to drive the respective forks to slide along the linear rails.

Each of the servo motors is provided with a rotation ring corresponding to each of the transmission wires. The servo motors drive the forks, via the rotation rings and the transmission wires corresponding to the rotation rings, to slide along the linear rails.

Four forks are included.

The present invention also provides a transportation device, which comprises a device body, linear rails mounted to the device body, a plurality of forks mounted in sequence to the linear rails, and servo motors mounted to the device body. The servo motors are coupled to the plurality of forks to drive the plurality of forks to slide along the linear rails.

The forks are arranged perpendicular to the linear rails with one end being coupled to the linear rails of the device body and an opposite end extending beyond the device body.

Each of the forks is connected to a transmission wire so that the fork is operatively coupled to the servo motors through the transmission wire, the servo motors driving the transmission wires to move back and forth so as to drive the respective forks to slide along the linear rails.

Each of the servo motors is provided with a rotation ring corresponding to each of the transmission wires. The servo motors drive the forks, via the rotation rings and the transmission wires corresponding to the rotation rings, to slide along the linear rails.

Four forks are included.

The efficacy of the present invention is that the present invention provides a transportation method of a liquid crystal panel, which uses a transportation device comprising position-adjustable forks so as to be fit for transportation of liquid crystal panels of various sizes and ensure uniformity of action of force in the process of transportation of the liquid crystal panel, thereby eliminating the situations of deformation and breaking caused by non-uniform force acting on the liquid crystal panel. Further, this method is also fit for transportation of ultrathin liquid crystal panel to lower the manufacture cost. Further, the present invention also provides a transportation device, which arranges a plurality of position-adjustable forks to realize transportation of liquid crystal panels of various sizes and can eliminate deformation and breaking occurring during the transportation of the liquid crystal panel and has a simple structure and low cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
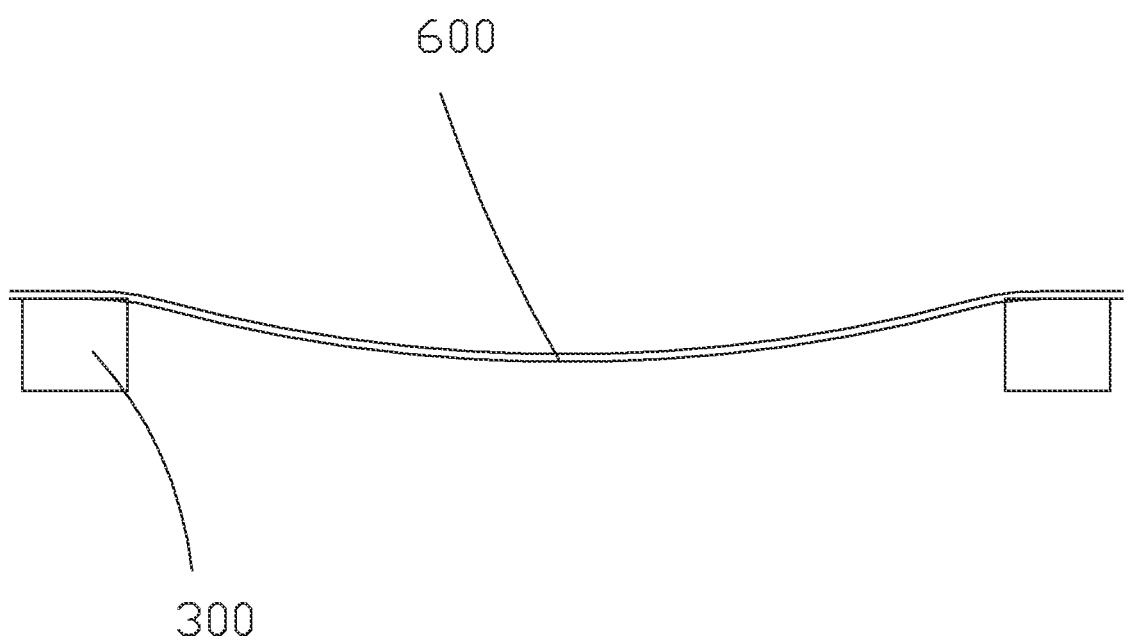
FIG. 1 is a schematic view illustrating the amount of deflecting deformation of a large-sized liquid crystal panel during transportation of the liquid crystal panel with a liquid crystal panel transportation device having two fixed forks.
Figure 2:
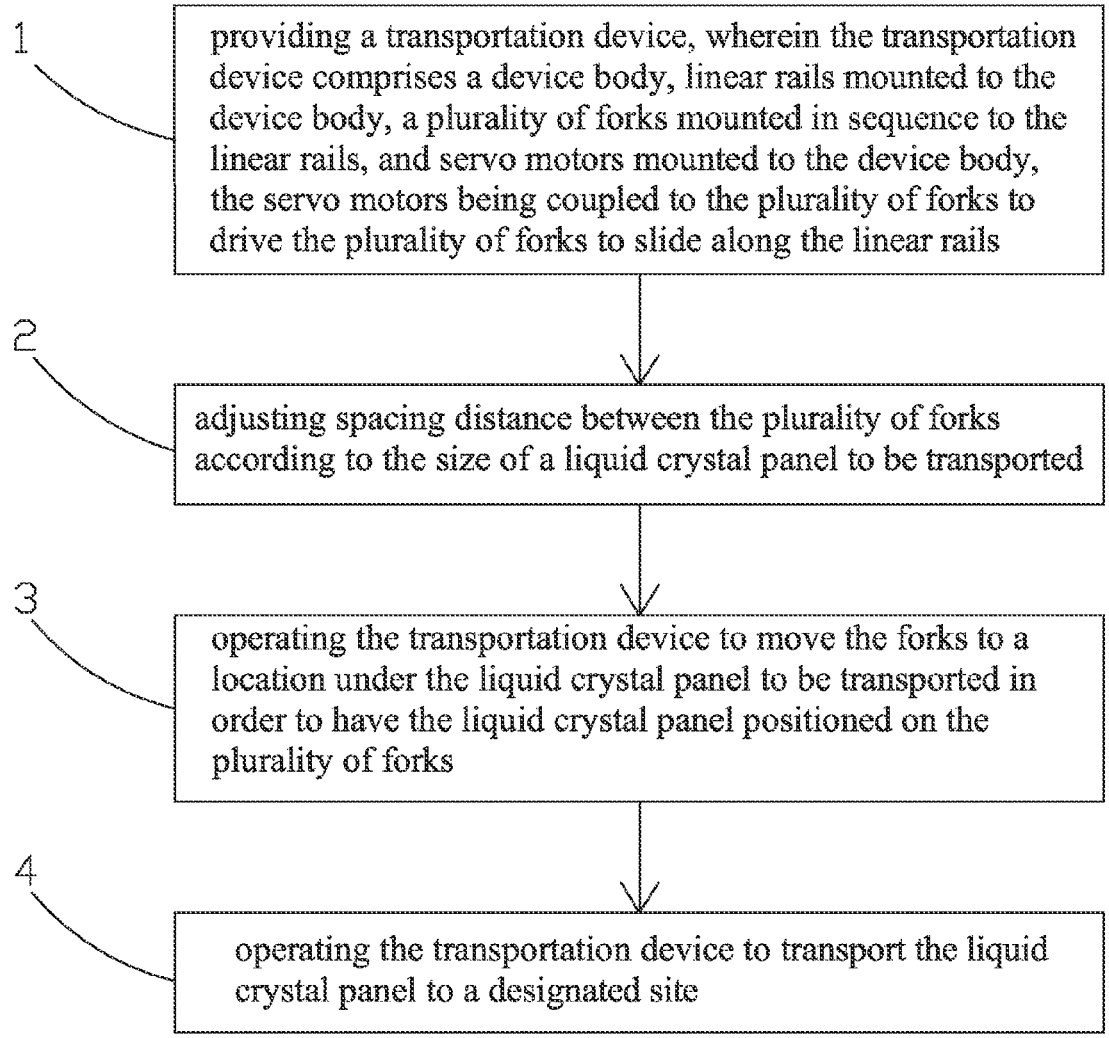
FIG. 2 is a flow chart illustrating a transportation method of a liquid crystal panel according to the present invention.

Referring to FIG. 2, in combination with FIGS. 3-6 collectively, the present invention provides a transportation method of a liquid crystal panel, which comprises the following steps:

Step 1: providing a transportation device, wherein the transportation device comprises a device body 10, linear rails 20 mounted to the device body 10, a plurality of forks 30 mounted in sequence to the linear rails 20, and servo motors 40 mounted to the device body 10. The forks 30 are arranged perpendicular to the linear rails 20 with one end being coupled to the linear rails 20 of the device body 10 and an opposite end extending beyond the device body 10. The servo motors 40 are coupled to the plurality of forks 30 to drive the plurality of forks 30 to slide along the linear rails 20.

Each of the forks 30 is connected to a transmission wire 32, so that the fork 30 is operatively coupled to the servo motors 40 through the transmission wire 32. The servo motors 40 drive the transmission wires 32 to move back and forth so as to drive the respective forks 30 to slide along the linear rails 20. In the instant embodiment, each of the servo motors 40 is provided with a rotation ring 42 corresponding to each of the transmission wires 32. The servo motors 40 drive the forks 30, via the rotation rings 42 and the transmission wires 32 corresponding to the rotation rings 42, to slide along the linear rails 20, whereby each of the forks 30 is independently movable along the linear rails 20 to effect adjustment of spacing distance between adjacent the forks 30.

Figure 4:
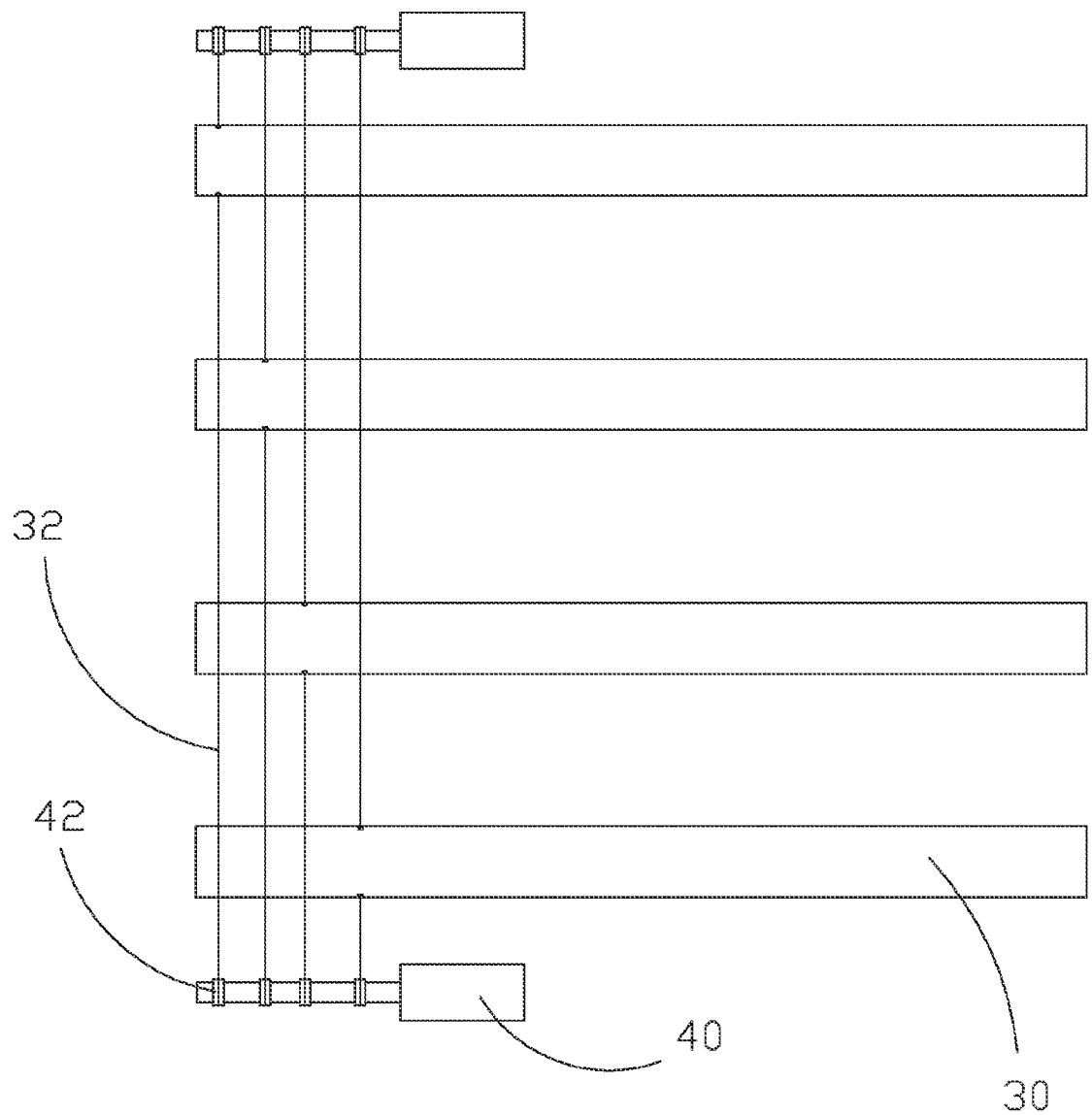
FIG. 4 is a schematic view illustrating transmission operation of the transportation device according to the present invention.

The servo motors 40 are the primary driving structure of the movements of the forks 30. In the instant embodiment, as shown in FIG. 4, the driving structure adopted comprises two servo motors 40 symmetrically arranged on the device body 10, respectively at two ends of the linear rails 20, to individually drive the forks 30 to reciprocally slide along the linear rails 20.

Further, the driving structure may alternatively comprise a servo motor 40 arranged at one end of the linear rails 20 and a shaft (not shown) arranged at an opposite end of the linear rails 20 to correspond to the servo motor 40, whereby through cooperative operation of the servo motor 40 and the shaft, the forks 30 are driven to slide reciprocally along the linear rails 20.

Further, the driving structure may alternatively comprises a servo motor 40 arranged under the linear rails 20 and rotation shafts (not shown) respectively arranged at opposite ends of the linear rails 20, whereby through cooperative operation of the servo motor 40 and the two rotation shafts, the forks 30 are driven to slide reciprocally along the linear rails 20.

Further, the servo motor(s) 40 may be replaced by other driving devices.

Step 2: adjusting spacing distance between the plurality of forks 30 according to the size of a liquid crystal panel 60 to be transported.

In the instant embodiment, four forks 30 are provided. The forks 30 can be arranged in an equally-spaced manner (see FIG. 3) or in a manner that every adjacent two forks closely juxtapose each other (see FIG. 5). If the size of the liquid crystal panel 60 to be transported is small, the forks 30 can be arranged to have every two adjacent ones immediately juxtaposed each other to thereby form two spaced groups of forks. Such a group of combined forks has a surface area greater than that of a single fork, so that a liquid crystal panel 60 carried thereon can have relatively uniform distribution of force acting thereon. If the size of the liquid crystal panel 60 to be transported is large, the four forks 30 are arranged in a mutually-spaced manner, preferably being equally spaced, so that the liquid crystal panel 60 carried thereon has relatively uniform distribution of force acting thereon and the amount of deflection of the liquid crystal panel is small (see FIG. 6), making it not possible to break.

Step 3: operating the transportation device to move the forks 30 to a location under the liquid crystal panel 60 to be transported in order to have the liquid crystal panel 60 positioned on the plurality of forks 30.

Step 4: operating the transportation device to transport the liquid crystal panel 60 to a designated site.

The present invention provides a transportation method of a liquid crystal panel, which uses a transportation device comprising position-adjustable forks so as to be fit for transportation of liquid crystal panels of various sizes and ensure uniformity of action of force in the process of transportation of the liquid crystal panel, thereby eliminating the situations of deformation and breaking caused by non-uniform force acting on the liquid crystal panel. Further, this method is also fit for transportation of ultrathin liquid crystal panel to lower the manufacture cost.

Figure 3:
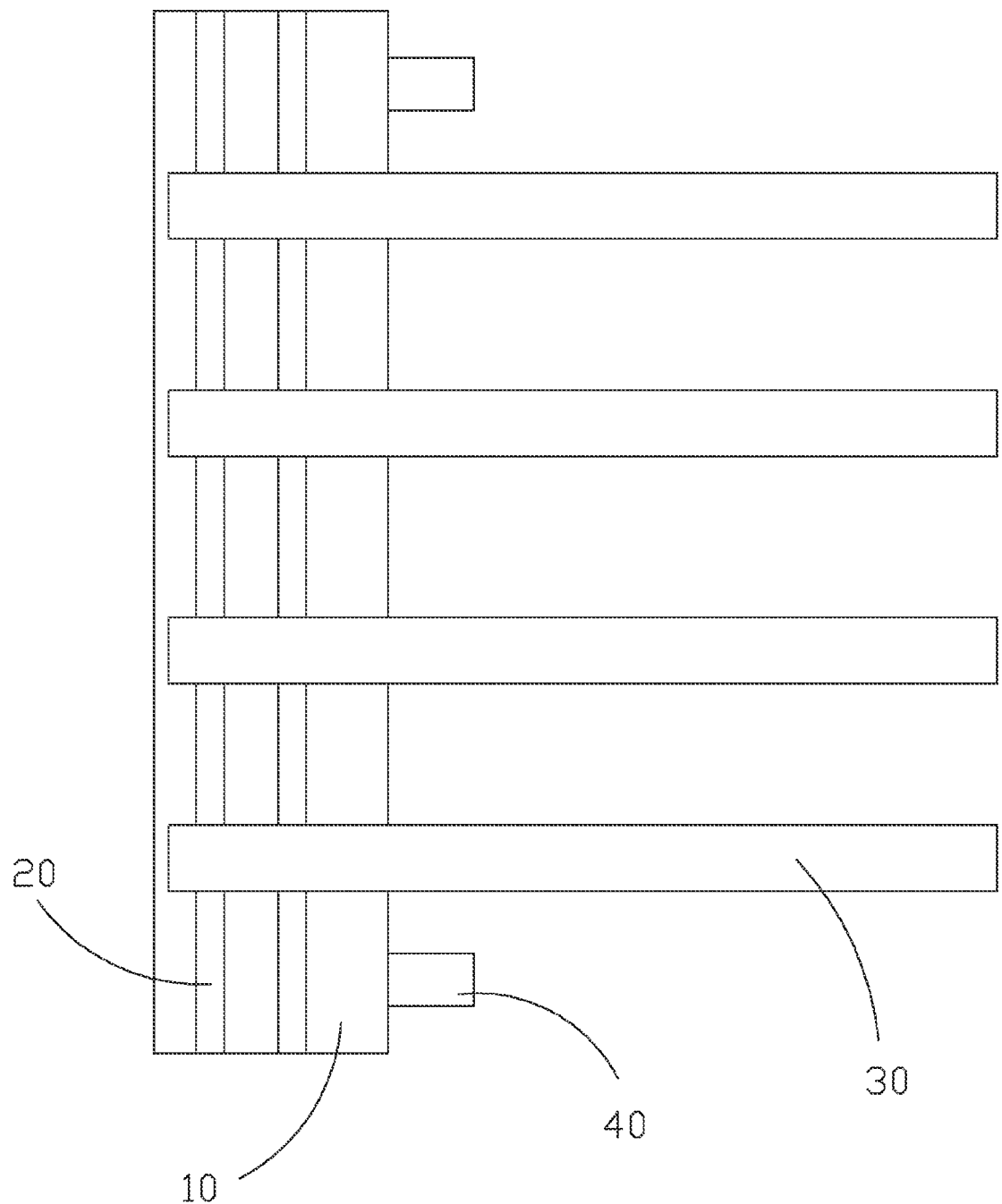
FIG. 3 is a schematic view illustrating the structure of a transportation device according to the present invention.
Figure 5:
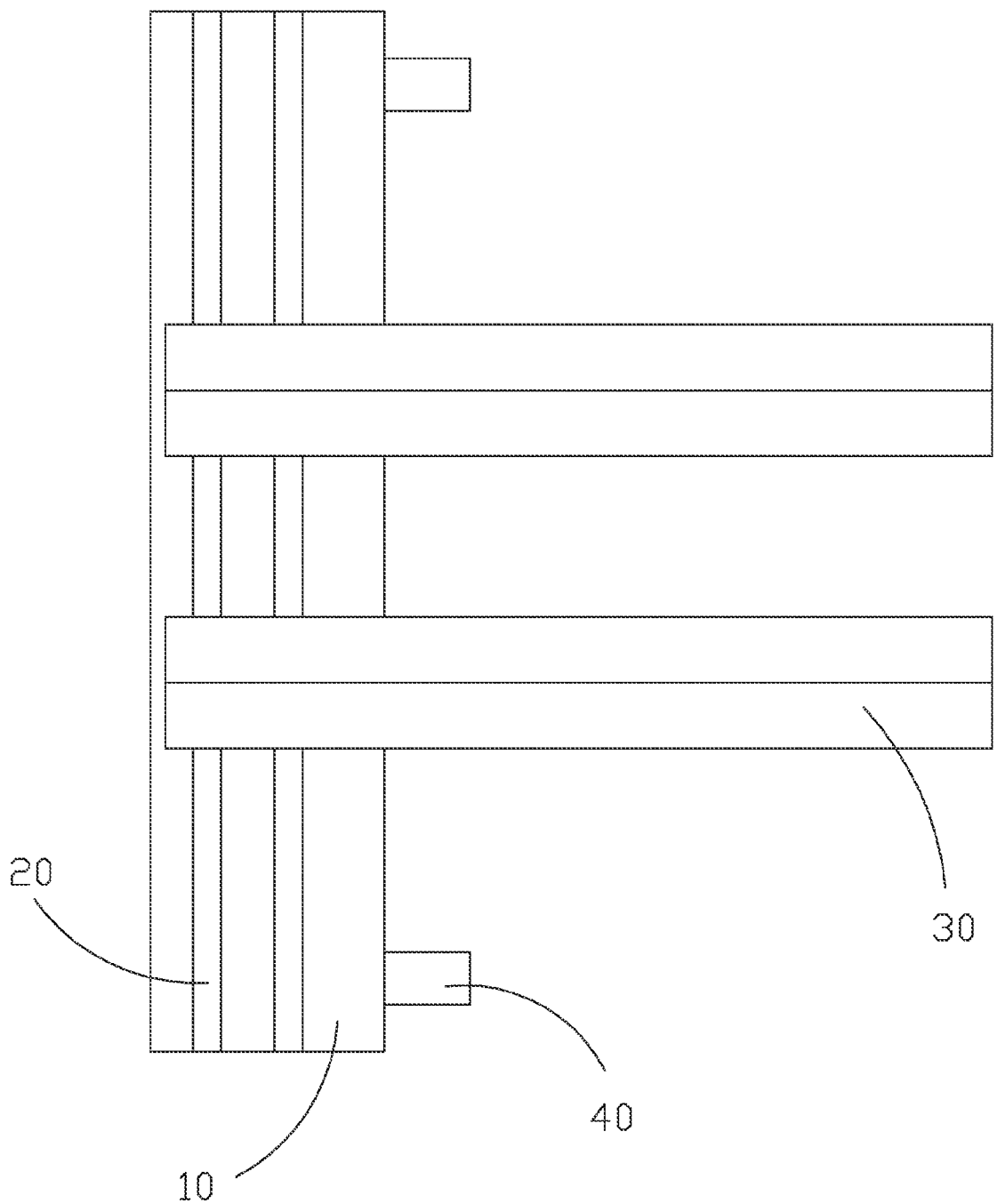
FIG. 5 is a schematic view illustrating an operation condition of the transportation device according to the present invention.
Figure 6:
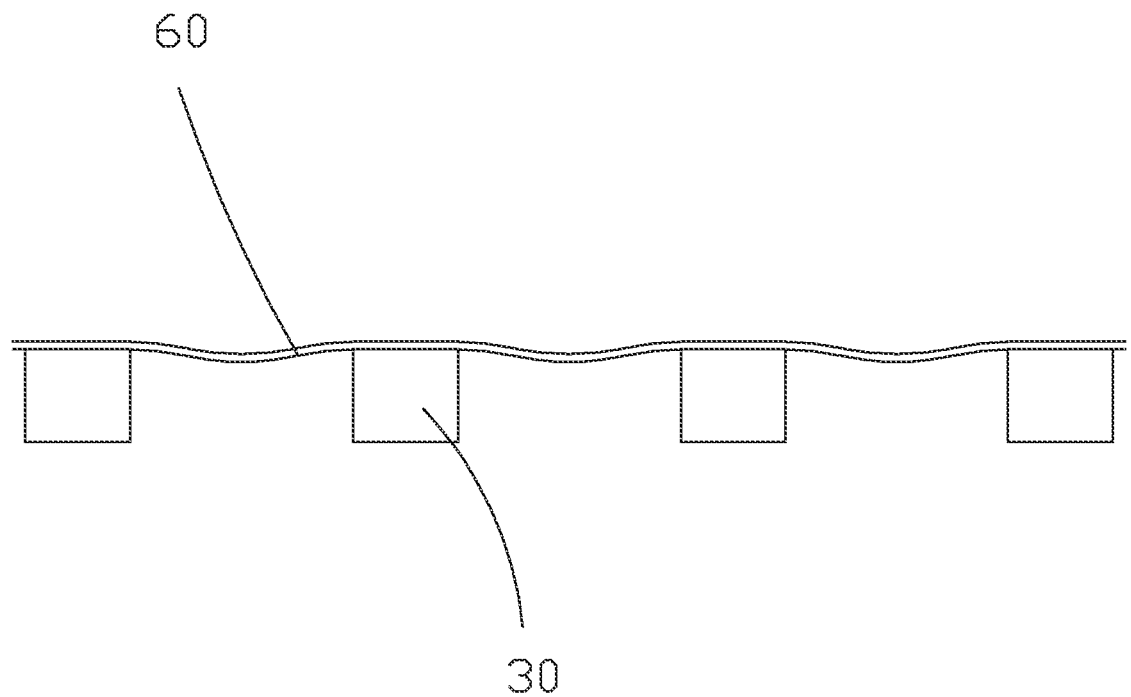
FIG. 6 is a schematic view illustrating the amount of deflecting deformation of a large-sized liquid crystal panel during transportation of the liquid crystal panel with a transportation device having four forks according to the present invention.

Referring to FIGS. 3-5, the present invention also provides a transportation device, which comprises a device body 10, linear rails 20 mounted to the device body 10, a plurality of forks 30 mounted in sequence to the linear rails 20, and servo motors 40 mounted to the device body 10. The forks 30 are arranged perpendicular to the linear rails 20 with one end being coupled to the linear rails 20 of the device body 10 and an opposite end extending beyond the device body 10. The servo motors 40 are coupled to the plurality of forks 30 to drive the plurality of forks 30 to slide along the linear rails 20.

Each of the forks 30 is connected to a transmission wire 32, so that the fork 30 is operatively coupled to the servo motors 40 through the transmission wire 32. The servo motors 40 drive the transmission wires 32 to move back and forth so as to drive the respective forks 30 to slide along the linear rails 20. In the instant embodiment, each of the servo motors 40 is provided with a rotation ring 42 corresponding to each of the transmission wires 32. The servo motors 40 drive the forks 30, via the rotation rings 42 and the transmission wires 32 corresponding to the rotation rings 42, to slide along the linear rails 20, whereby each of the forks 30 is independently movable along the linear rails 20 to effect adjustment of spacing distance between adjacent the forks 30.

The servo motors 40 are the primary driving structure of the movements of the forks 30. In the instant embodiment, as shown in FIG. 4, the driving structure adopted comprises two servo motors 40 symmetrically arranged on the device body 10, respectively at two ends of the linear rails 20, to individually drive the forks 30 to reciprocally slide along the linear rails 20.

Further, the driving structure may alternatively comprise a servo motor 40 arranged at one end of the linear rails 20 and a shaft (not shown) arranged at an opposite end of the linear rails 20 to correspond to the servo motor 40, whereby through cooperative operation of the servo motor 40 and the shaft, the forks 30 are driven to slide reciprocally along the linear rails 20.

Further, the driving structure may alternatively comprises a servo motor 40 arranged under the linear rails 20 and rotation shafts (not shown) respectively arranged at opposite ends of the linear rails 20, whereby through cooperative operation of the servo motor 40 and the two rotation shafts, the forks 30 are driven to slide reciprocally along the linear rails 20.

Further, the servo motor(s) 40 may be replaced by other driving devices.

In the instant embodiment, four forks 30 are provided. The forks 30 can be arranged in an equally-spaced manner (see FIG. 3) or in a manner that every adjacent two forks closely juxtapose each other (see FIG. 5). If the size of the liquid crystal panel 60 to be transported is small, the forks 30 can be arranged to have every two adjacent ones immediately juxtaposed each other to thereby form two spaced groups of forks. Such a group of combined forks has a surface area greater than that of a single fork, so that a liquid crystal panel 60 carried thereon can have relatively uniform distribution of force acting thereon. If the size of the liquid crystal panel 60 to be transported is large, the four forks 30 are arranged in a mutually-spaced manner, preferably being equally spaced, so that the liquid crystal panel 60 carried thereon has relatively uniform distribution of force acting thereon and the amount of deflection of the liquid crystal panel is small (see FIG. 6), making it not possible to break.

The present invention provides a transportation device, which arranges a plurality of position-adjustable forks to realize transportation of liquid crystal panels of various sizes and can eliminate deformation and breaking occurring during the transportation of the liquid crystal panel and has a simple structure and low cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A transportation method of a liquid crystal panel, comprising the following step:
    Step 1: providing a transportation device, wherein the transportation device comprises a device body, linear rails perpendicularly mounted to the device body and extending horizontally, a plurality of forks mounted in sequence to the linear rails in such a way that the forks each has one end slidably coupled to the linear rails and an opposite end extending horizontally beyond the device body to collectively define a horizontal plane adapted to receive and support thereon a liquid crystal panel, and servo motors mounted to the device body and respectively set at opposite ends of the linear rails, the servo motors being operatively coupled to each of the plurality of forks through a transmission wire having two ends respectively coupled to the servo motors at the two ends of the linear rails to drive the plurality of forks to slide along the linear rails;
    Step 2: adjusting spacing distance between the plurality of forks according to the size of a liquid crystal panel to be transported;
    Step 3: operating the transportation device to move the forks to a location under the liquid crystal panel to be transported in order to have the liquid crystal panel positioned on the plurality of forks, wherein the plurality of forks are substantially arranged on a common horizontal plane defined by the linear rails that extend horizontally and the plurality of forks are respectively connected to the transmission wires with the two ends of each of the transmission wires respectively coupled to rotational rings that are coupled to and operatively driven by the servo motors at the two ends of the linear rails in a horizontal direction so as to reduce an overall height of the transportation device to help move the forks to the location under the liquid crystal panel; and
    Step 4: operating the transportation device to transport the liquid crystal panel to a designated site.

2. The transportation method of a liquid crystal panel as claimed in claim 1, wherein the servo motors drive the forks, via the rotation rings and the transmission wires corresponding to the rotation rings, to slide along the linear rails.

3. The transportation method of a liquid crystal panel as claimed in claim 1, wherein four forks are included.

4. A transportation device, comprising a device body, linear rails perpendicularly mounted to the device body and extending horizontally, a plurality of forks mounted in sequence to the linear rails in such a way that the forks each has one end slidably coupled to the linear rails and an opposite end extending horizontally beyond the device body to collectively define a horizontal plane adapted to receive and support thereon a liquid crystal panel, and servo motors mounted to the device body and respectively set at opposite ends of the linear rails, the servo motors being operatively coupled to each of the plurality of forks through a transmission wire having two ends respectively coupled to the servo motors at the two ends of the linear rails to drive the plurality of forks to slide along the linear rails, wherein the plurality of forks are substantially arranged on a common horizontal plane defined by the linear rails that extend horizontally and the plurality of forks are respectively connected to the transmission wires with the two ends of each of the transmission wires respectively coupled to rotational rings that are coupled to and operatively driven by the servo motors at the two ends of the linear rails in a horizontal direction.

5. The transportation device as claimed in claim 4, wherein the servo motors drive the forks, via the rotation rings and the transmission wires corresponding to the rotation rings, to slide along the linear rails.

6. The transportation device as claimed in claim 4, wherein four forks are included.

7. A transportation device, comprising a device body, linear rails perpendicularly mounted to the device body and extending horizontally, a plurality of forks mounted in sequence to the linear rails in such a way that the forks each has one end slidably coupled to the linear rails and an opposite end extending horizontally beyond the device body to collectively define a horizontal plane adapted to receive and support thereon a liquid crystal panel, and servo motors mounted to the device body and respectively set at opposite ends of the linear rails, the servo motors being operatively coupled to each of the plurality of forks through a transmission wire having two ends respectively coupled to the servo motors at the two ends of the linear rails to drive the plurality of forks to slide along the linear rails;

wherein the plurality of forks are substantially arranged on a common horizontal plane defined by the linear rails that extend horizontally and the plurality of forks are respectively connected to the transmission wires with the two ends of each of the transmission wires respectively coupled to rotational rings that are coupled to and operatively driven by the servo motors at the two ends of the linear rails in a horizontal direction; and wherein the servo motors drive the forks, via the rotation rings and the transmission wires corresponding to the rotation rings, to slide along the linear rails.

* * * * *